(12) United States Patent
Gailhard

(10) Patent No.: US 12,209,917 B2
(45) Date of Patent: *Jan. 28, 2025

(54) TEMPERATURE DETECTION DEVICE AND METHOD USING SETS OF DC VOLTAGES

(71) Applicant: STMicroelectronics (Rousset) SAS, Rousset (FR)

(72) Inventor: Bruno Gailhard, Peypin (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

This patent is subject to a terminal disclaimer.

(21) Appl. No.: 17/947,461

(22) Filed: Sep. 19, 2022

(65) Prior Publication Data

US 2023/0019539 A1 Jan. 19, 2023

Related U.S. Application Data

(63) Continuation of application No. 16/576,377, filed on Sep. 19, 2019, now Pat. No. 11,454,554.

(30) Foreign Application Priority Data

Sep. 28, 2018 (FR) ...................................... 1859036

(51) Int. Cl.
*G01R 33/09* (2006.01)
*G01K 7/01* (2006.01)
*G01K 15/00* (2006.01)
*G01R 19/00* (2006.01)

(52) U.S. Cl.
CPC ............. *G01K 15/005* (2013.01); *G01K 7/01* (2013.01); *G01R 19/00* (2013.01); *G01R 19/0038* (2013.01); *G01R 19/0084* (2013.01)

(58) Field of Classification Search
CPC ...... G01K 15/00; G01K 7/00; G01K 3/04; G01K 15/005; G01K 7/01; G01K 3/005; G01K 7/021; G01K 15/007; G01K 1/026; G01K 7/206; G01K 19/00; G01K 5/00; G01K 7/18; G01K 7/13; G01R 19/0084; G01R 15/144; G01R 35/005; G01R 17/00; G01R 31/08; G01R 27/08; G01R 27/14; G01R 31/00; G01R 19/16542; G01R 21/14; G01R 19/30; G01R 19/0023; G01R 19/10; G01R 31/2874; G01R 31/2829; G01R 31/318566; G01R 19/16566; G06F 1/206; G06F 11/3058
See application file for complete search history.

(56) References Cited

U.S. PATENT DOCUMENTS 4,576,487 A 3/1986 Conover, Jr. et al.
4,901,060 A * 2/1990 Liu .......................... G01K 7/01
327/512

(Continued)

FOREIGN PATENT DOCUMENTS

EP 2573531 A2 3/2013

*Primary Examiner* — Vinh P Nguyen
(74) *Attorney, Agent, or Firm* — Slater Matsil, LLP

(57) ABSTRACT

Two sets of the DC voltages are determined from among sets of DC voltages. At a first temperature, a first voltage of one of the two sets and a first voltage of the other one of the two sets surround a detection voltage that varies substantially proportionally to temperature. The detection voltage is compared with a second voltage of one of the two sets.

20 Claims, 6 Drawing Sheets

(56) References Cited

U.S. PATENT DOCUMENTS

| | | | |
|---|---|---|---|
| 6,975,103 B1 * | 12/2005 | Blom | G01R 27/14 |
| | | | 324/99 D |
| 7,171,327 B2 * | 1/2007 | Kim | G01K 3/005 |
| | | | 702/136 |
| 7,849,332 B1 * | 12/2010 | Alben | G06F 1/3203 |
| | | | 713/320 |
| 7,977,999 B2 * | 7/2011 | Igarashi | G01K 3/005 |
| | | | 327/512 |
| 9,702,763 B2 | 7/2017 | Horng et al. | |
| 10,566,783 B2 | 2/2020 | Cass | |
| 10,792,999 B2 * | 10/2020 | Harrington | B22C 9/10 |
| 10,852,197 B2 * | 12/2020 | Geetla | H03K 21/38 |
| 10,908,192 B2 * | 2/2021 | Gailhard | G01R 19/16595 |
| 11,099,080 B2 * | 8/2021 | Jeong | H03M 1/1061 |
| 11,454,554 B2 * | 9/2022 | Gailhard | G01R 19/0084 |
| 2005/0264971 A1 | 12/2005 | Morino | |
| 2007/0140308 A1 | 6/2007 | Hsu et al. | |
| 2013/0076381 A1 | 3/2013 | Takayanagi et al. | |
| 2015/0247764 A1 | 9/2015 | Camarena et al. | |
| 2020/0103928 A1 | 4/2020 | Gailhard | |
| 2020/0132558 A1 | 4/2020 | Chern et al. | |

* cited by examiner

TEMPERATURE DETECTION DEVICE AND METHOD USING SETS OF DC VOLTAGES

CROSS-REFERENCE TO RELATED APPLICATIONS

This application is a continuation of U.S. patent application Ser. No. 16/576,377, filed Sep. 19, 2019, now U.S. Pat. No. 1,154,554, which claims priority to French Patent Application No. 1859036, filed on Sep. 28, 2018, which applications are hereby incorporated by reference herein in their entirety.

TECHNICAL FIELD

The invention generally concerns electronic circuits, and more generally the detection of a temperature in an electronic circuit.

BACKGROUND

Electronic circuits, e.g., integrated circuits, are designed to operate in given temperature ranges, are known.

When such a circuit reaches a temperature outside of the range for which it is designed, malfunctions may occur in the circuit.

SUMMARY

An embodiment provides a temperature detection method and/or device.

An embodiment overcomes all or part of the disadvantages of known temperature detection methods and/or devices.

An embodiment provides a method and/or a device of detection of two temperatures.

An embodiment provides a device which is calibrated at a calibration temperature different from the temperature(s) that it detects, particularly at a calibration temperature in the range from 10 to 50° C.

An embodiment provides a device comprising steps of calibration of such a detection device.

An embodiment provides a temperature detection device which can be tested, particularly at ambient temperature.

An embodiment provides a method comprising a step of testing such a detection device.

An embodiment provides a method comprising the steps of: a) determining, from among sets of DC voltages, two sets such that a first voltage of one of the two sets and a first voltage of the other one of the two sets surround, at a first temperature, a detection voltage varying substantially proportionally or proportionally to temperature; and b) comparing the detection voltage with a second voltage of one of the two sets.

According to an embodiment, a first interval, substantially constant or constant for each of the sets, separates the first and second voltages of each set, the first interval being preferably substantially equal or equal to the theoretical variation of the detection voltage between the first temperature and a second temperature.

According to an embodiment, the first temperature is in the range from 10 to 50° C., preferably from 20 to 40° C., preferably from 25 to 35° C., preferably approximately equal or equal to 30° C.

According to an embodiment, the first voltage of each set is equal, to within a few millivolts, for example, to within 10 mV, to the theoretical value of the detection voltage at the first temperature.

According to an embodiment, each set further comprises a third voltage, the method further comprising a step c) of comparing the third voltage of said one of the two sets with the detection voltage.

According to an embodiment, a second substantially constant or constant interval separates, for each of the sets, the first and third voltages of the set, the second interval being preferably substantially equal or equal to the theoretical variation of the detection voltage between the first temperature and a third temperature.

According to an embodiment, steps b) and c) are carried out simultaneously, or step b) or c) is selected based on a comparison of the detection voltage with a fourth DC voltage between the second voltages and the third voltages.

According to an embodiment, the method further comprises the steps of: placing, in an environment at the first temperature, a device capable of implementing the method; measuring the temperature of the device; and applying, to all the DC voltages, an offset based on a difference between the measured temperature and the first temperature.

According to an embodiment, the method further comprises, at a temperature substantially equal or equal to the first temperature, comparing the detection voltage with a fifth DC voltage greater than all the first voltages and comparing the detection voltage with a sixth DC voltage smaller than all the first voltages.

Another embodiment provides a device capable of implementing the above-described method.

According to an embodiment, the device comprises: a first circuit of selection of one of the sets; a second circuit of selection of a first threshold voltage from among at least the voltages of the selected set; and a first comparator of the first threshold voltage with the detection voltage.

According to an embodiment, the device comprises a second comparator of a second threshold voltage with the detection voltage.

According to an embodiment, the second threshold voltage is the fourth voltage and the second circuit is configured to select the first threshold voltage from among the first, second, and third voltages of the selected set, at least partly based on an output signal of the second comparator; or the second threshold voltage is the third voltage of the selected set and the second circuit is configured to select the first threshold voltage among the first and second voltages of the selected set.

According to an embodiment, the second circuit is configured to further select the first threshold voltage from among the fifth and sixth voltages.

According to an embodiment, the second circuit is configured to select the second threshold voltage from among the fourth, fifth, and sixth voltages, and to select the first threshold voltage from among the first and second voltages of the selected set and the fifth and sixth voltages, at least partly based on an output signal of the second comparator; or the second circuit is configured to select the second threshold voltage from among the third voltage of the selected set and the fifth and sixth voltages and to select the first threshold voltage from among the first and second voltages of the selected set and the fifth and sixth voltages.

According to an embodiment, the device further comprises a circuit for supplying each DC voltage.

According to an embodiment, the device further comprises a temperature sensor and a fourth circuit configured to apply to each DC voltage a same offset determined based on an output signal of the sensor when the device is in an environment at the first temperature.

The foregoing and other features and advantages will be discussed in detail in the following non-limiting description of specific embodiments in connection with the accompanying drawings.

DETAILED DESCRIPTION OF ILLUSTRATIVE EMBODIMENTS

Figure 1:
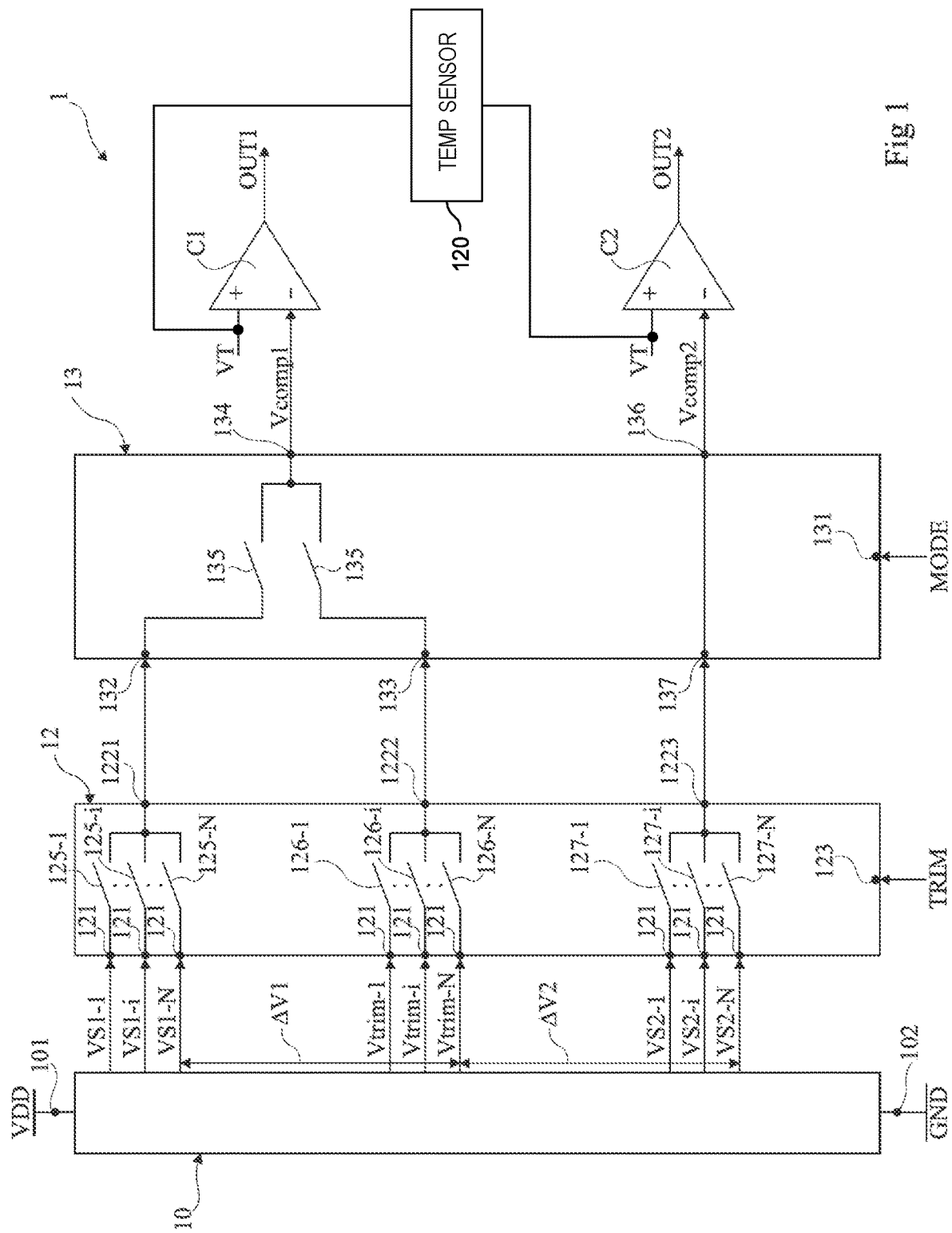
FIG. 1 schematically shows an embodiment of a device of detection of at least one temperature, and more particularly, of two temperatures.

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed. In particular, the electronic circuits, particularly microcontrollers, where the described embodiments may be provided, have not been detailed, such embodiments being compatible with usual circuits.

Throughout the present disclosure, the term "connected" is used to designate a direct electrical connection between circuit elements with no intermediate elements other than conductors, whereas the term "coupled" is used to designate an electrical connection between circuit elements that may be direct, or may be via one or more intermediate elements.

In the following description, when reference is made to terms qualifying absolute positions, such as terms "front," "back," "top," "bottom," "left," "right," etc., or relative positions, such as terms "above," "under," "upper," "lower," etc., or to terms qualifying directions, such as terms "horizontal," "vertical," etc., unless otherwise specified, it is referred to the orientation of the drawings.

The terms "about," "substantially," and "approximately" are used herein to designate a tolerance of plus or minus 10%, preferably of plus or minus 5%, of the value in question.

In the rest of the description, when reference is made to a DC voltage, unless otherwise specified, this means a voltage having a substantially constant, preferably constant, value.

FIG. 1 schematically shows an embodiment of a device 1 of detection of at least one temperature, in this example, two temperatures.

Device 1 comprises a temperature sensor 120 that is a source of a detection voltage VT. Voltage VT varies substantially proportionally, preferably proportionally, to the temperature of device 1. In the described example, the value of voltage VT increases as the temperature of device 1 increases. As a variation, the value of voltage VT decreases as the temperature of device 1 increases.

In an alternative embodiment, not illustrated, voltage source VT is external to device 1, the source of voltage VT for example forming part of an electronic circuit comprising device 1, for example, an integrated circuit such as a microcontroller.

Device 1 further comprises a circuit 10 receiving, between terminals 101 and 102, a substantially constant, preferably constant, DC voltage VDD. Voltage VDD is for example positive and referenced to terminal 102, for example, ground GND. Circuit 10 supplies, from power supply voltage VDD, N sets of DC voltages, N being an integer greater than 2, preferably greater than 3. Each set comprises a calibration voltage Vtrim-i, i being the index of the considered set in the range from 1 to N, and a voltage for each temperature which is desired to be detected, that is, in the present example, a voltage VS1-$i$ to detect a temperature TS1 and a voltage VS2-$i$ to detect a temperature TS2, i being the index of the considered set. Voltages VS1-$i$, Vtrim-$i$, and VS2-$i$ output by circuit 10 have substantially constant, preferably constant values, whatever the temperature of device 1. As an example, circuit 10 is a resistive voltage dividing bridge.

In an alternative embodiment, not illustrated, circuit 10 is external to device 1, circuit 10 for example forming part of an electronic circuit comprising device 1, for example, an integrated circuit such as a microcontroller.

Voltages Vtrim-i have values different from one another. Preferably, voltages Vtrim-i follow an order, their values being either decreasing with index i as in the shown example, or increasing with index i. Voltages Vtrim-i are selected so that, at a calibration temperature Ttrim, two voltages Vtrim-i surrounding the real or practical value of voltage VT can be determined. When it is considered that two voltages selected from among the N voltages Vtrim-i surround voltage VT, this means that one of the two voltages is the closest to voltage VT among the voltages Vtrim-i greater than voltage VT, and that the other one of the two voltages is the voltage Vtrim-i closest to voltage VT from among the voltages Vtrim-i smaller than voltage VT. Voltages Vtrim-i are for example equal, to within a few millivolts, for example 10 mV, to the theoretical value of voltage VT at calibration temperature Ttrim. As an example, temperature Ttrim is in the range from 10 to 50° C., for example from 20 to 40° C., preferably from 25 to 35° C., more preferably still approximately equal to 30° C., for example, equal to 30° C. The interval between two successive voltages Vtrim-i is for example substantially constant, preferably constant.

In each set, a same substantially constant, preferably constant, voltage interval ΔV1 separates voltages VS1-$i$ and Vtrim-i of the set. Interval ΔV1 is substantially equal, preferably equal, to the theoretical variation of voltage VT between calibration temperature Ttrim and temperature TS1. As an example, temperature TS1 is greater than 100° C., for example, in the range from 100 to 150° C., preferably in the range from 120 to 130° C., for example, approximately equal to 125° C., preferably equal to 125° C. Temperature TS1 is for example the high limit of a temperature range where an electronic circuit comprising device 1 is intended to operate.

Similarly, in each set, a same substantially constant, preferably constant, voltage interval ΔV2 separates voltages VS2-$i$ and Vtrim-i of the set. Interval ΔV2 is substantially equal, preferably equal, to the theoretical variation of voltage VT between calibration temperature Ttrim and temperature TS2. As an example, temperature TS2 is smaller than −20° C., preferably in the range from −25 to −35° C., for example, equal to approximately −30° C., preferably equal to −30° C. Temperature TS2 is for example the low limit of a temperature range where an electronic circuit comprising device 1 is intended to operate.

Device 1 further comprises a circuit 12 of selection of a set of DC voltages from among the N sets of DC voltages. Circuit 12 comprises as many inputs 121 as there are voltages VS1-$i$ (VS1-1, . . . , VS1-$i$, . . . , VS1-N), Vtrim-$i$ (Vtrim-1, . . . , Vtrim-$i$, . . . , Vtrim-N), and VS2-$i$ (VS2-1, . . . , VS2-$i$, . . . , VS2-N) output by circuit 10, each input 121 receiving one of the voltages. Circuit 12 comprises as many outputs that there are voltages per set, that is, three outputs 1221, 1222, and 1223 in the present example. Circuit 12 also comprises an input 123 receiving a control signal TRIM, preferably a digital control signal, for example, coded over a plurality of bits. Circuit 12 is configured to select one of the N sets according to the value of signal TRIM and to supply voltages VS1-$i$, Vtrim-$i$, and VS2-$i$ of the selected set on its respective outputs 1221, 1222, and 1223.

In the shown example, circuit 12 comprises N switches 125-$i$ (with i varying from 1 to N), each switch 125-$i$ coupling the input 121 receiving voltage VS1-$i$ to output 1221. Circuit 12 also comprises N switches 126-$i$ (with i varying from 1 to N), each switch 126-$i$ coupling the input 121 receiving voltage Vtrim-$i$ to output 1222. Circuit 12 further comprises N switches 127-$i$ (with i varying from 1 to N), each switch 127-$i$ coupling the input 121 receiving voltage VS2-$i$ to output 1223. When signal TRIM controls the selection of the set having index i, switches 125-$i$, 126-$i$ and 127-$i$ turn on, the other switches of circuit 12 being left off.

Device 1 also comprises a circuit 13 for selecting a threshold voltage Vcomp1 from among voltages VS1-$i$, Vtrim-$i$, and VS2-$i$ of the selected set, and more particularly, in the present embodiment, from among voltages VS1-$i$ and Vtrim-$i$ of the selected set. The selection of voltage Vcomp1 from among these voltages is determined by a control signal MODE, preferably a digital control signal, for example, coded over a plurality of bits, received by an input 131 of circuit 13.

In this example, inputs 132 and 133 of the circuit receive respective voltages VS1-$i$ and Vtrim-$i$ of the selected set, and an output 134 of circuit 13 supplies voltage Vcomp1. In the shown example, circuit 13 comprises two switches 135 coupling output 134 to respective inputs 132 and 133. Switches 135 are controlled by signal MODE.

Threshold voltage Vcomp1 is supplied to a voltage comparator C1 of device 1. Comparator C1 compares voltage Vcomp1 with voltage VT and supplies an output signal OUT1, preferably, a binary signal representative of this comparison, for example, in a first logic state when voltage VT is smaller than voltage Vcomp1, and in a second logic state otherwise. As an example, comparator C1 is an operational amplifier having its inverting input (−) for example receiving voltage Vcomp1, and having its non-inverting input (+) for example receiving voltage VT.

In this example where device 1 is configured to detect two temperatures TS1 and TS2, device 1 comprises another comparator C2. Comparator C2 compares a threshold voltage Vcomp2 with voltage VT and delivers an output signal OUT2, for example, a binary signal, representative of this comparison, for example, in a first logic state when voltage VT is smaller than voltage Vcomp2 and in a second logic state otherwise. As an example, comparator C2 is an operational amplifier having its inverting input (−) for example receiving voltage Vcomp2, and having its non-inverting input (+) for example receiving voltage VT.

In this embodiment, threshold voltage Vcomp2 corresponds to the voltage VS2-$i$ of the set selected by circuit 12. In the shown example, voltage Vcomp2 is supplied to comparator C2 by an output 136 of circuit 13, circuit 13 comprising an input 137 connected to output 1223 of circuit 12 and to output 136 of circuit 13. As a variation, output 1223 of circuit 12 is directly connected to comparator C2, without using circuit 13.

Device 1 described hereabove is capable of implementing a method of detecting temperatures TS1 and TS2 which will now be described in relation with FIG. 2.

Figure 2:
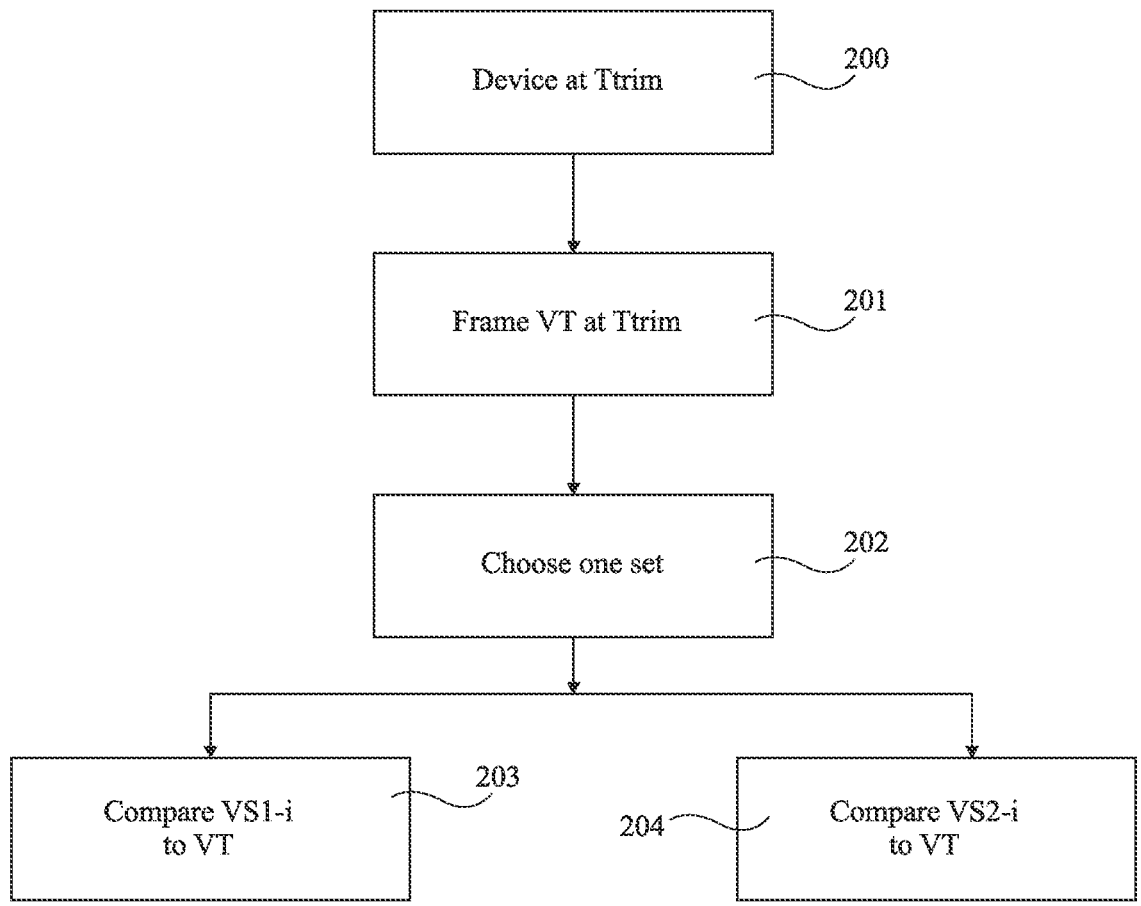
FIG. 2 shows, in the form of blocks, an embodiment of a method of detection of at least one temperature.

FIG. 2 shows, in the form of blocks, an embodiment of a temperature detection method. In the described example, the method is implemented by device 1 to detect temperatures TS1 and TS2.

The method comprises calibration steps 200, 201, and 202 and steps 203 and 204 of detection of respective temperatures TS1 and TS2.

At step 200 (block Device at Ttrim), device 1 is set to calibration temperature Ttrim. As an example, this step is carried out by means of a test bench enabling to control the temperature of an enclosure having device 1 placed therein, the temperature of the enclosure being then taken to and then maintained at calibration temperature Ttrim.

At the next step 201 (block Frame VT at Ttrim), carried out while the enclosure having device 1 arranged therein is maintained at temperature Ttrim, the two sets having their voltages Vtrim-$i$ surrounding voltage VT at temperature Ttrim are determined. For this purpose, circuit 13 is controlled by signal MODE so that voltage Vcomp1 is equal to voltage Vtrim-$i$ received from circuit 12. Further, circuit 12 is controlled by signal TRIM to successively select at least some, preferably all of, the N sets of voltages. Thus, for each selected set, output signal OUT1 enables to determine whether the voltage Vtrim-$i$ of this set is greater or smaller than the real or practical value of voltage VT at calibration temperature Ttrim. Knowing the values of voltages Vtrim-$i$, or at least the order of the values of voltages Vtrim-$i$, the two voltages Vtrim-$i$ surrounding voltage VT at temperature Ttrim can be deduced. As an example, step 201 is implemented by determining the two voltages Vtrim-$i$ of successive values corresponding to two different logic states of signal OUT1. As an example, information representative of the two voltages Vtrim-$i$ surrounding voltage VT at temperature Ttrim is stored.

At the next step 202 (block Choose one set), one of the two sets determined at step 201 is selected. Signal TRIM corresponding to the selected set is stored, preferably non-volatilely.

The end of step 202 marks the end of the calibration. Once calibrated, device 1 is used to detect temperatures TS1 and TS2, during respective steps 203 and 204.

Step 203 (block Compare VS1-$i$ to VT) following step 202 comprises comparing voltage VS1-$i$ of the set selected at step 202 with voltage VT. For this purpose, circuit 12 selects the set selected at step 202, for example, by supplying circuit 12 with the signal TRIM stored at step 202, and circuit 13 is controlled by signal MODE so that voltage Vcomp1 is equal to voltage VS1-$i$ of the selected set. When the temperature of device 1 increases to reach and then exceed temperature TS1, voltage VT increases to reach and then exceed voltage Vcomp1, whereby signal OUT1 switches state, which enables to detect temperature TS1.

In this example, the method further comprises step 204 (block Compare VS2-$i$ to VT), which comprises comparing voltage VS2-$i$ of the set selected at step 202 with voltage VT. In this embodiment, steps 203 and 204 are carried out simultaneously, that is, signals TRIM and MODE are identical for the two steps 203 and 204. The comparison of voltage VS2-i of the set selected at voltage VT is here performed by comparator C2, the latter receiving voltage Vcomp2 equal to voltage VS2-i of the selected set. When the temperature of device 1 decrease to reach and then become lower than temperature TS2, voltage VT decreases to reach and then become lower than voltage Vcomp2, whereby signal OUT2 switches state, which enables to detect temperature TS2.

In the above method, the calibration enables to select a voltage Vtrim-i, and more generally of a set of voltages Vtrim-i, VS1-i, and VS2-i, taking into account the possible voltage offset of comparator C1 and/or the possible offset between the theoretical and effective values of voltage VT. This results in a decrease, or even in a suppression, of the effect of such offsets on the detection of temperatures TS1 and TS2, and thus in a better detection accuracy.

It could have been devised to perform, by means of a test bench, a calibration step at each of temperatures TS1 and TS2 to be detected, but this would however have resulted in an increase in the number of steps necessary to calibrate device 1. Further, at the temperatures considered herein, a test bench provided for a temperature TS1 or TS2 is more complex and more expensive than a test bench provided for temperature Ttrim. Further, for the considered temperatures, the time necessary to obtain a stable temperature TS1 or TS2 in a test bench is significantly longer than that necessary to obtain a stable temperature Ttrim.

In an alternative embodiment of the method described hereabove, an additional step of testing the device implementing the method, and more particularly a step of testing the voltage comparators of the device, is provided. Two DC test voltages Vtest1 and Vtest2, possibly selected from among respective voltages VS1-i and VS2-i, are then provided. One of voltages Vtest1 and Vtest2, for example, voltage Vtest1, is selected to be greater than voltage VT at a test temperature, preferably the ambient temperature, the other one of voltages Vtest1 and Vtest2 being selected to be smaller than voltage VT at the test temperature, preferably with a security margin taking into account the possible interval between the theoretical and practical values of voltage VT at the test temperature and/or possible voltage offsets of the comparators. As an example, the security margin is in the range from 10 to 20 mV. According to a preferred embodiment, the calibration temperature is substantially equal to the test temperature and voltages Vtest1 and Vtest2 are respectively greater and smaller than voltages Vtrim-i, although, as a variation, they may be respectively greater and smaller than voltages Vtrim-i.

During a first phase of the test step implemented at the test temperature, one of the two voltages Vtest1 and Vtest2 is supplied to each comparator of the device. In a second phase of the test step, also implemented at the test temperature, the other one of voltages Vtest1 and Vtest2 is supplied to each comparator of the device. Each comparator is considered as functional if the output signal that it supplies switches state between the two test phases, the device being considered as functional if all the comparators are functional.

In another variation of the above-described method, an additional step of calibration of the device implementing the method is provided. Such an additional step is preferably carried out between steps 200 and 201. This additional calibration step comprises applying, to all the DC voltages independent from temperature, a same determined offset to compensate for a possible interval between the inner temperature of the device and the temperature of the environment where it is placed during the calibration. Once determined, the offset is applied during the remaining calibration steps and during the temperature detection steps. This results in a better accuracy of the temperature detection. As an example, during this additional calibration step, the inner temperature of the device is measured, for example, by means of a temperature sensor, and the offset to be applied is for example selected to be substantially equal or equal to the theoretical variation of voltage VT between the calibration temperature Ttrim and the measured temperature.

The two above-described variations may be combined.

Figure 3:
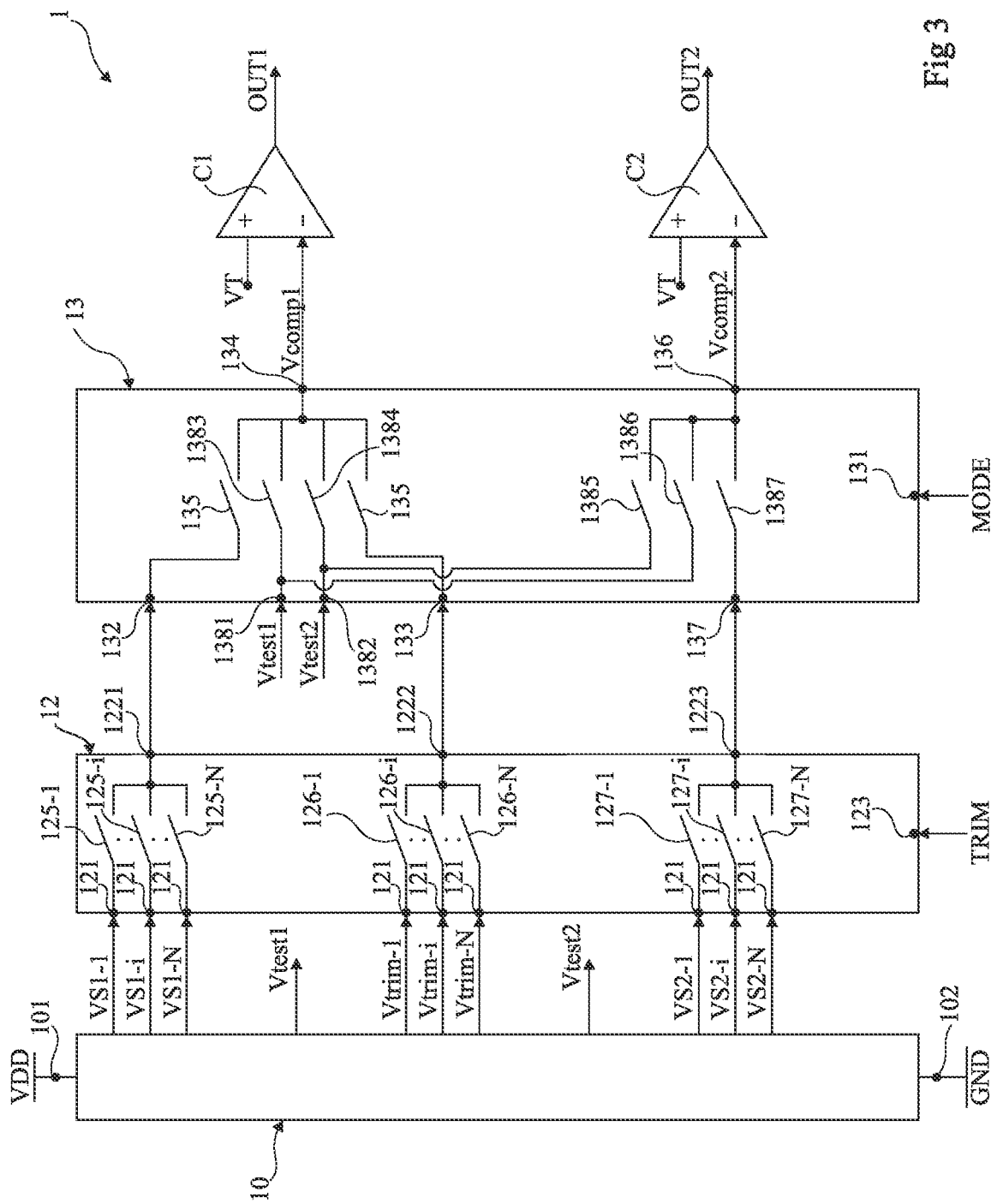
FIG. 3 schematically shows an alternative embodiment of the device of FIG. 1.

FIG. 3 shows an alternative embodiment of device 1 of FIG. 1. To simplify the description, only the differences between the device 1 of FIG. 1 and the device 1 of FIG. 3 are detailed. In this variation, device 1 is capable of implementing the alternative embodiment of the method of FIG. 2 where an additional step of testing device 1 is provided.

In this example, voltages Vtest1 and Vtest2 are supplied by circuit 10. In this embodiment, the calibration temperature is substantially equal to the ambient temperature and voltages Vtest1 and Vtest2 are respectively greater than and smaller than voltages Vtrim-i, although, as a variation, they may be respectively smaller and greater than voltages Vtrim-i.

Circuit 13 is configured to select voltages Vcomp1 and Vcomp2 from among voltages VS1-i, Vtrim-i, and VS2-i of the set selected by circuit 12, and, further, from among voltages Vtest1 and Vtest2. More particularly, when device 1 is being tested, circuit 13 is configured to select voltages Vcomp1 and Vcomp2 from among voltages Vtest1 and Vtest2. Voltages Vcomp1 and Vcomp2 are for example equal to voltage Vtest1 in the first phase of the test, and to voltage Vtest2 in the second phase of the test. As a variation, voltages Vcomp1 and Vcomp2 may be different from each other during each of the first and second phases of the test.

In the example of FIG. 3, circuit 13 comprises two additional inputs 1381 and 1382 receiving respective voltages Vtest1 and Vtest2. The circuit further comprises two switches 1383 and 1384 connecting output 134 to respective inputs 1381 and 1382. The circuit further comprises switches 1385, 1386, and 1387 connecting output 136 to respective inputs 1381, 1382, and 137. During the first test phase, one of switches 1383 and 1384 is on and one of switches 1385 and 1386 is on, the other switches of circuit 13 being left off, and, during the second test phase, the other one of switches 1383 and 1384 is on and the other one of switches 1385 and 1386 is on, the other switches of circuit 13 being left off. The off or on state of each switch of circuit 13 is determined by signal MODE, for example, at a first value during the calibration (steps 200, 201, and 203, FIG. 2), at a second value during the detection of temperatures TS1 and TS2 (steps 203 and 204, FIG. 2), at a third value during the first phase of the test step, and at a fourth value during the second phase of the test phase.

It should be noted that, in this example, on detection of temperature TS2 (step 204, FIG. 2), switch 1387 is turned on while switches 1385 and 1386 are off so that voltage Vcomp2 is equal to voltage VS2-i of the set selected by circuit 12.

Figure 4:
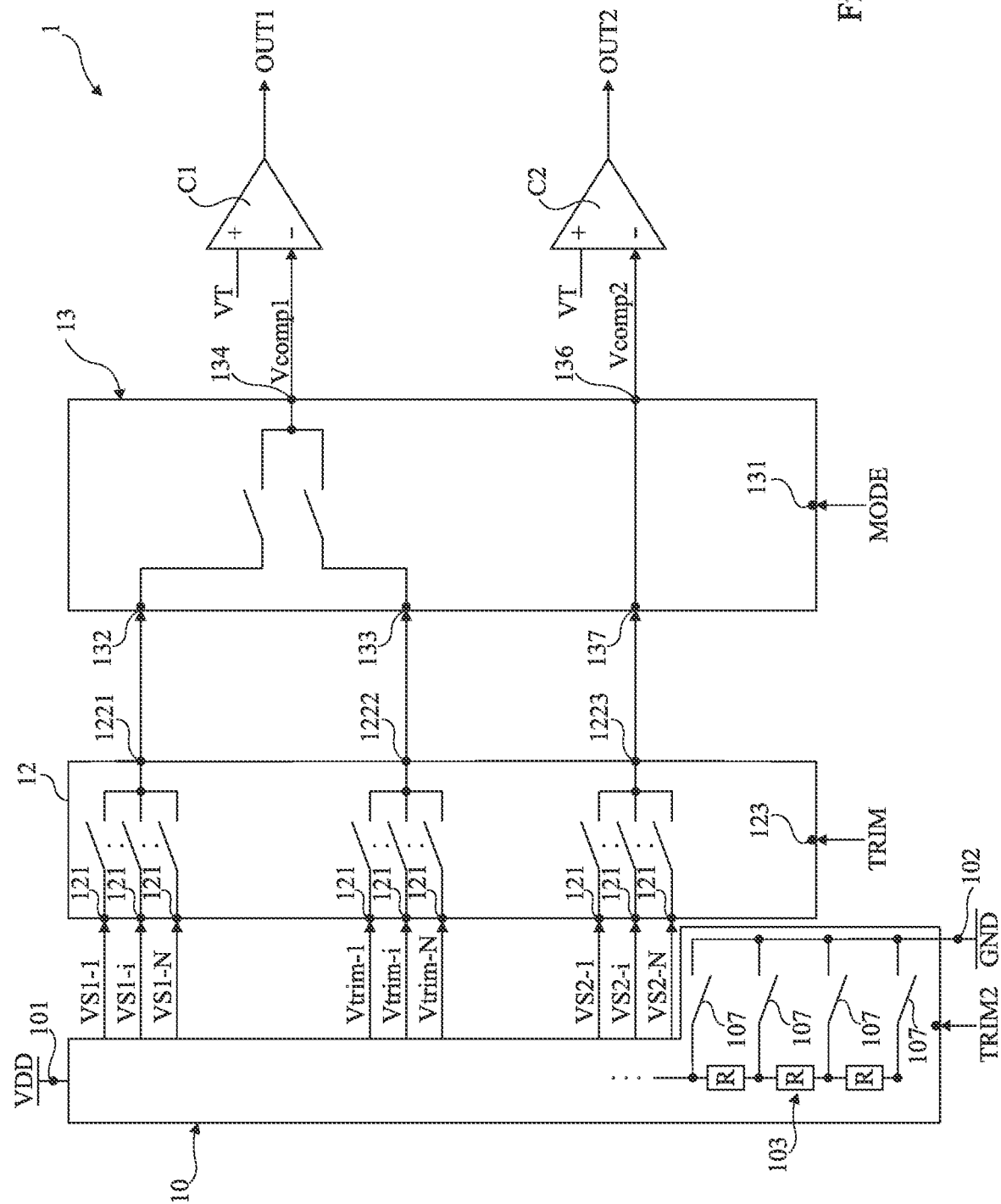
FIG. 4 schematically shows another alternative embodiment of the device of FIG. 1.

FIG. 4 shows another alternative embodiment of the device of FIG. 1. To simplify the description, only the differences between device 1 of FIG. 1 and device 1 of FIG. 4 are detailed. In this variation, device 1 is capable of implementing the alternative embodiment of the method of FIG. 2 where an additional calibration step is provided.

Device 1 comprises a calibration device or circuit 103, for example, internal to circuit 10, controlled by a signal TRIM2, for example, received by an input 104 of circuit 10. Device 103 is configured to apply, to all the voltages supplied by circuit 10, a same offset to compensate for a possible interval between the inner temperature of device 1 and temperature Ttrim of the environment of device 1 during the calibration. In this example where circuit 10 is a resistive dividing bridge, circuit 103 is configured to modify the total resistance of dividing bridge 10 according to the signal TRIM2 that it receives. As an example, circuit 103 comprises resistors R in series between terminal 102 and the portion of resistive bridge 10 supplying voltages Vtrim-i, VS1-i, and VS2-i and, for each connection node between two resistors R, between a resistor R and terminal 102 and/or between a resistor R and the rest of bridge 10, a switch 107 coupling this node to terminal 102. According to signal TRIM2, a selected switch 107 is maintained on, the other switches 107 being left off.

Device 1 further comprises a temperature sensor 120. As a variation, the temperature sensor may be external to device 1, for example, provided in an integrated circuit comprising device 1. The value of the offset to be applied is determined from the output signal of the temperature sensor, this signal being representative of a measurement of the inner temperature of device 1 or of the integrated circuit comprising device 1. Signal TRIM2 is then determined so that circuit 103 applies this offset, or at least an offset substantially equal to the determined offset, to the voltages output by circuit 10. Signal TRIM2 thus determined is stored, preferably non-volatilely.

The alternative embodiments of the devices of FIGS. 3 and 4 may be combined.

In another variation, not shown, the method of FIG. 2 is provided to detect a single temperature TS1. In this case, step 204 is omitted. Further, device 1 of FIGS. 1, 3, and 4 is accordingly adapted and comprises neither comparator C2, not any of the elements used to supply voltage Vcomp2 to comparator C2.

Figure 5:
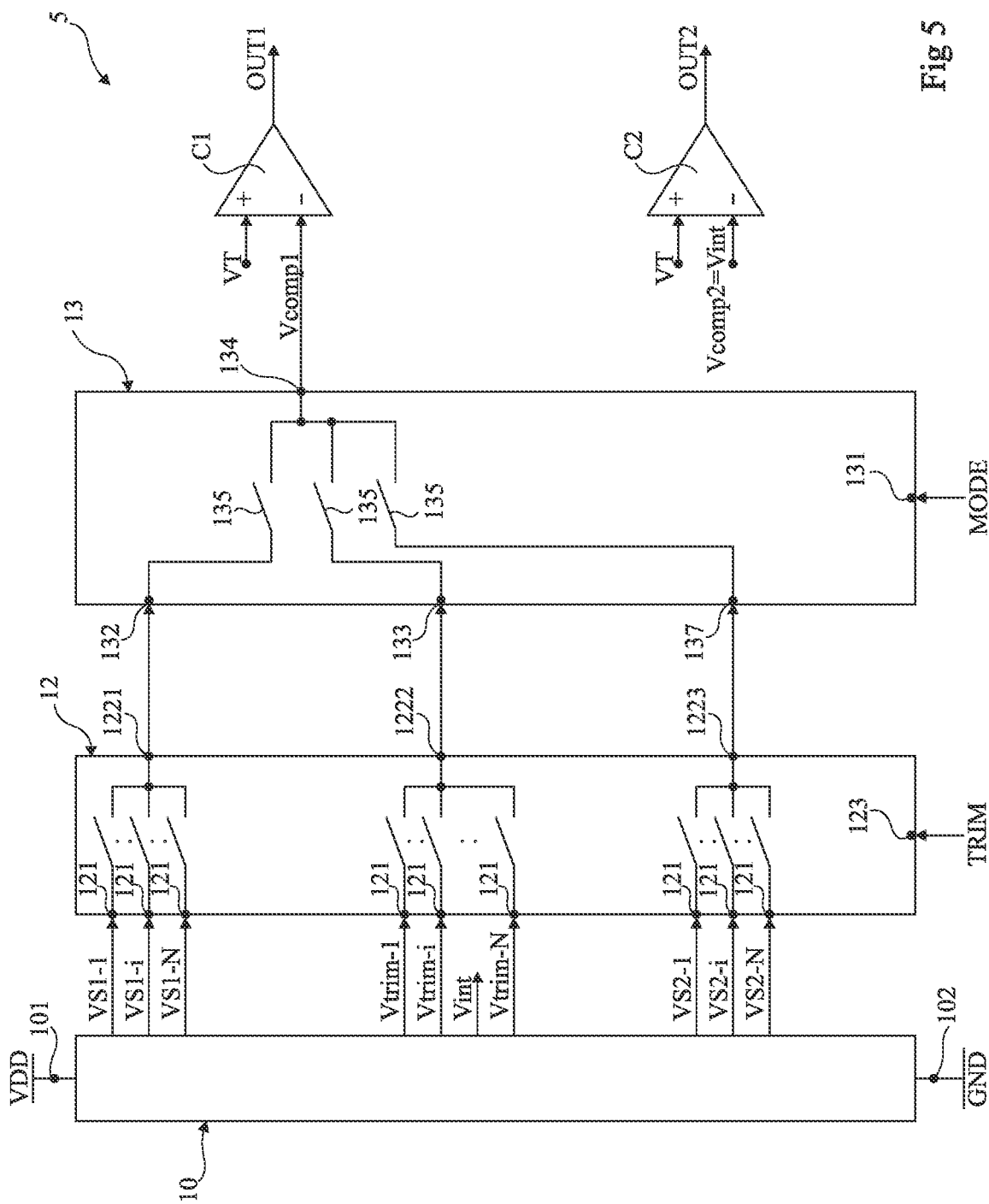
FIG. 5 schematically shows another embodiment of a device of detection of two temperatures.

FIG. 5 schematically shows another embodiment of a device 5 of detection of at least two temperatures, in the present example, the two temperatures TS1 and TS2. To simplify the description, only the differences between device 5 and device 1 of FIG. 1 are detailed.

In this embodiment, circuit 10 outputs an intermediate voltage Vint. Voltage Vint has a value smaller than the values of voltages VS1-i and greater than the values of voltages VS2-i. Voltage Vint is thus representative of an intermediate temperature Tint between temperatures TS1 and TS2. In this example, voltage Vint is an additional voltage output by circuit 10. As a variation, voltage Vint corresponds to one of voltages Vtrim-i.

In this embodiment, circuit 13 is configured to select voltage Vcomp1 from among voltages Vtrim-i, VS1-i, and VS2i of the set selected by circuit 12. More particularly, in the illustrated example, circuit 13 comprises a third switch 135 coupling its input 137 to its output 134.

In this embodiment, voltage Vcomp2 is equal to voltage Vint. In the shown example, voltage Vint is directly supplied to comparator C2. As a variation, voltage Vcomp2 equal to Vint may be supplied to comparator C2 via circuit 13, for example, by an output of circuit 13 directly connected to an input of circuit 13 receiving voltage Vint.

In this embodiment, signal MODE is at least partly determined based on signal OUT2.

Figure 6:
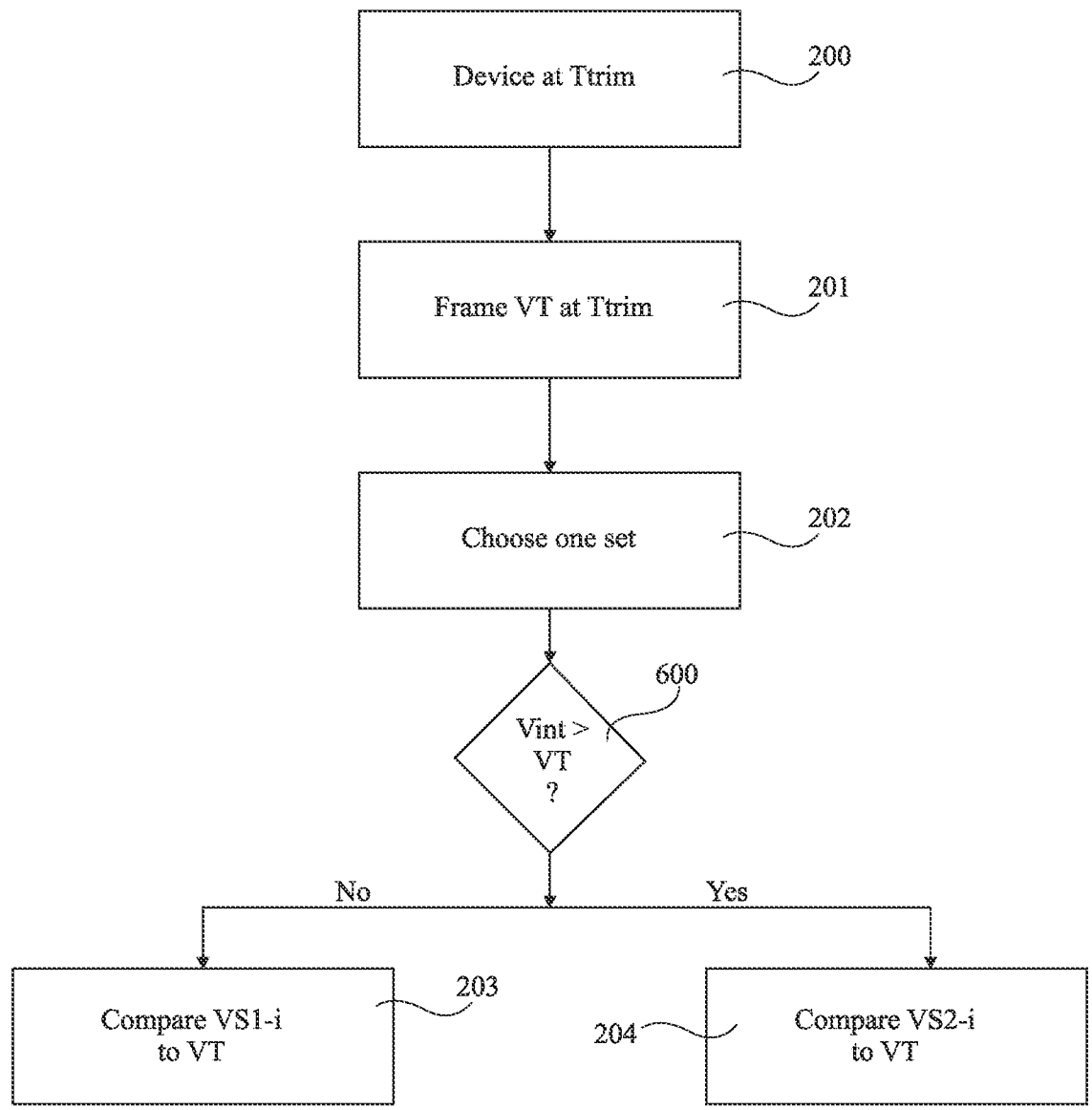
FIG. 6 shows in the form of blocks another embodiment of a method of detection of two temperatures.

FIG. 6 shows, in the form of blocks, another embodiment of a method of detecting two temperatures, in this example, temperatures TS1 and TS2. In the described example, the method is implemented by device 5 of FIG. 5.

The method comprises the same successive steps 200, 201, and 202 as the method described in relation with FIG. 2. The method of FIG. 6 also comprises steps 203 and 204. However, unlike the method of FIG. 2 where steps 203 and 204 are carried out simultaneously, in the method of FIG. 6, a single one of steps 203 and 204 is selected and implemented, according to the result of a test 600 (block Vint>VT?) following step 202. In device 5 of FIG. 5, the test is implemented by comparator C2, signal OUT2 being representative of the result of this test.

If voltage Vint is greater than voltage VT (output Yes of block 600), this means that the temperature of device 5 is, like temperature TS2 in the present example, smaller than intermediate temperature Tint, and step 204 is then implemented. To achieve this, signal MODE is determined based on signal OUT2 so that voltage Vcomp1 is equal to voltage VS2-i of the selected set. In other words, signal MODE is such that switch 135 connecting input 137 and output 134 of circuit 13 is on, the other switches 135 being off.

Conversely, if voltage Vint is smaller than voltage VT (output No of block 600), this means that the temperature of device 5 is, like temperature TS1 in the present example, greater than intermediate temperature Tint, and step 203 is then implemented. To achieve this, signal MODE is determined based on signal OUT2 so that voltage Vcomp1 is equal to voltage VS1-i of the selected set. In other words, signal MODE is such that switch 135 connecting input 132 and output 134 of circuit 13 is turned on, the other switches 135 being off.

As compared with device 1 where two different comparators C1 and C2 are used to compare voltage VT with the respective voltages VS1-i and VS2-i of the selected set, in device 5, the same comparator C1 is used to compare voltage VT with the two voltages VS1-i and VS2-i. Due to the fact that the calibration of the device (steps 200, 201, and 203, FIG. 2) takes into account the possible voltage offset of comparator C1, device 5 enables to detect temperature TS2 more accurately than device 1 when comparators C1 and C2 have different voltage offsets.

The alternative embodiments of the method described in relation with FIG. 2 and their combination apply to the method of FIG. 6 and the corresponding alternative embodiments of device 1 such as described in relation with FIGS. 3 and 4 can be transposed to device 5 of FIG. 5. For example, when the alternative embodiment of FIG. 3 is applied to the device of FIG. 5, circuit 13 is configured to select, according to control signal MODE, voltage Vcomp1 from among voltages Vtest1, Vtest2 and voltages VS1-i, VS2-i, and Vtrim-i of the selected set, and voltage Vcomp2 from among voltages Vtest1, Vtest2, and Vint. More particularly, when the device is testing comparators C1 and C2, circuit 13 supplies voltage Vtest1 or Vtest2 to comparators C1 and C2, when device 5 is being calibrated, circuit 13 supplies the voltage Vtrim-i that it receives to comparator C1 and, when the device is in a phase of detection of temperatures TS1 and TS2, circuit 13 supplies voltage Vint to comparator C2 and, according to signal OUT2, one of the voltages VS1-i and VS2-i that it receives to comparator C1.

Further, although devices 1 and 5 detecting two temperatures TS1 and TS2 have been described, these devices may be adapted to detect more than two temperatures, for example, by adapting the number of voltages of each set of DC voltages output by circuit 10, circuit 12, and by further adapting circuit 13 and, if necessary, the number of comparators, the methods of FIGS. 2 and 6 and their variations being accordingly adapted.

Various embodiments and variations have been described. Those skilled in the art will understand that certain features of these various embodiments and variations may be combined, and other variations will occur to those skilled in the art. In particular, although embodiments where voltage VT increases with temperature have been described herein, such embodiments and variations may be adapted to the case of a voltage VT decreasing as the temperature increases. Further, voltage VDD, and thus voltages VS1-$i$, Vtrim-$i$, VS2-$i$, Vtest1, Vtest2, and Vint, may all be negative.

Further, although this is not shown in FIGS. 1, 3, 4, and 5, each of devices 1 and 5 may comprise a processing and control circuit, for example, connected to the output of each comparator of the device and, if present, to a temperature sensor, the circuit being configured to determine and output signals MODE, TRIM and, possibly, TRIM2, and/or to store information relative to the implementation of the described methods.

Finally, the practical implementation of the described embodiments and variations is within the abilities of those skilled in the art based on the functional indications given hereabove. In particular, as concerns the selection of the values of voltages VS1-$i$, Vtrim-$i$, VS2-$i$, Vtest1, Vtest2, and Vint, it is within the abilities of those skilled in the art, in the light of the present description, to select these values, particularly according to the desired calibration and/or detection accuracy.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A device comprising:
   a voltage divider coupled between a voltage supply node and a reference node, the voltage divider having a plurality of DC voltage outputs;
   a first switching circuit having a first plurality of inputs coupled to a first subset of the outputs of the voltage divider and a second plurality of inputs coupled to a second subset of the outputs of the voltage divider, the first switching circuit including a first switch coupled between the first plurality of inputs and a first output and a second switch coupled between the second plurality of inputs and a second output, wherein the first switching circuit also includes an input coupled to a first trim value input; and
   a second switching circuit having a first input coupled to the first output of the first switching circuit and a second input coupled to the second output of the first switching circuit, wherein the second switching circuit also includes an input coupled to a second trim value input.

2. The device of claim 1, further comprising a first comparator having a first input coupled to an output of the second switching circuit and a second input coupled to a detection voltage node that is configured to carry a detection voltage that varies substantially proportionally to temperature.

3. The device of claim 2, further comprising a second comparator having a first input coupled to the detection voltage node and a second input coupled to a second output of the second switching circuit.

4. The device of claim 3, wherein each of the first comparator and the second comparator is an operational amplifier.

5. The device of claim 2, further comprising a temperature sensor configured to measure an inner temperature of the device for providing the detection voltage.

6. The device of claim 1, wherein the first trim value input is different from the second trim value input.

7. A device, comprising:
   a first circuit configured to:
      receive a plurality of sets of DC voltages,
      determine from the plurality of sets of DC voltages two sets of the DC voltages at a first temperature, wherein a first voltage of one of the two sets and a second voltage of the other one of the two sets surround a detection voltage that varies substantially proportionally to temperature, and
      select one of the two sets;
   a second circuit configured to select a first threshold voltage from among the voltages of the selected set; and
   a comparator configured to compare the first threshold voltage with the detection voltage.

8. The device of claim 7, further comprising a second comparator configured to compare a second threshold voltage with the detection voltage.

9. The device of claim 8, wherein each set further comprises a third DC voltage and a fourth DC voltage that is between the second voltage and the third voltage, and wherein the second threshold voltage is the fourth voltage and the second circuit is configured to select the first threshold voltage from among the first, second, and third voltages of the selected set, at least partly based on an output signal of the second comparator.

10. The device of claim 8, wherein each set further comprises a third DC voltage and a fourth DC voltage that is between the second voltage and the third voltage, and wherein the second threshold voltage is the third voltage of the selected set and the second circuit is configured to select the first threshold voltage from among the first and second voltages of the selected set.

11. The device of claim 8, wherein the second circuit is configured to further select the first threshold voltage from among a fifth DC voltage that is greater than the first voltages of all the sets of DC voltages and a sixth DC voltage that is smaller than the first voltages of all the sets of DC voltages.

12. The device of claim 11, wherein each set further comprises a third DC voltage and a fourth DC voltage that is between the second voltage and the third voltage, and wherein the second circuit is configured to select the second threshold voltage from among the fourth, fifth, and sixth voltages, and to select the first threshold voltage from among the first and second voltages of the selected set and the fifth and sixth voltages, at least partly based on an output signal of the second comparator.

13. The device of claim 11, wherein the second circuit is configured to select the second threshold voltage from among a third voltage of the selected set and the fifth and sixth voltages and to select the first threshold voltage from among the first and second voltages of the selected set and the fifth and sixth voltages.

14. The device of claim 7, further comprising a temperature sensor and a fourth circuit configured to apply a same offset to each DC voltage, the same offset determined based on an output signal of the temperature sensor when the device is in an environment at the first temperature.

15. A device, comprising:
- a first circuit configured to determine a first set of DC voltages and a second set of DC voltages from a plurality of sets of DC voltages, wherein, at a first temperature, a first voltage of the first set of DC voltages and a first voltage of the second set of DC voltages, each of the first voltage of the first set of DC voltages and the first voltage of the second set of DC voltages surround a detection voltage that varies substantially proportionally to temperature;
- a second circuit configured to select a first threshold voltage from among the voltages of the first set of DC voltages and the second set of DC voltages; and
- a comparator configured to compare the detection voltage with a first threshold voltage of the first set of DC voltages or a second threshold of the second set of DC voltages.

16. The device of claim 15, wherein a first interval that is substantially constant or constant for each set of the plurality of sets of DC voltages separates the first voltage and the first threshold voltage of the first set of DC voltages and separates the first voltage and the second threshold of the second set of DC voltages.

17. The device of claim 16, wherein the first interval is substantially equal to a theoretical variation of the detection voltage between the first temperature and a second temperature, wherein the theoretical variation is an expected change based on calculations or known voltage-temperature relationship characteristics.

18. The device of claim 15, wherein the first temperature is in a range between 10 and 50° C.

19. The device of claim 18, wherein the first temperature is in a range between 20 and 40° C.

20. The device of claim 19, wherein the first temperature is in a range between 25 and 35° C.

* * * * *